(12) United States Patent
Thomas et al.

(10) Patent No.: US 11,668,923 B2
(45) Date of Patent: Jun. 6, 2023

(54) SYSTEMS AND METHOD FOR IMPROVED NIGHT VISION

(71) Applicant: Maranon, Inc., Eagle Rock, VA (US)

(72) Inventors: Nils I. Thomas, Eagle Rock, VA (US); Joseph P. Estrera, Boise, ID (US); James K. Thomas, Eagle Rock, VA (US)

(73) Assignee: MARANON, INC., Eagle Rock, VA (US)

( * ) Notice: Subject to any disclaimer, the term of this patent is extended or adjusted under 35 U.S.C. 154(b) by 623 days.

(21) Appl. No.: 16/503,297

(22) Filed: Jul. 3, 2019

(65) Prior Publication Data

US 2020/0012087 A1 Jan. 9, 2020

Related U.S. Application Data

(60) Provisional application No. 62/694,326, filed on Jul. 5, 2018.

(51) Int. Cl.
| | |
|---|---|
| G02B 23/00 | (2006.01) |
| G02B 25/00 | (2006.01) |
| G02B 7/04 | (2021.01) |
| G02B 13/16 | (2006.01) |
| G02B 23/12 | (2006.01) |
| H05K 9/00 | (2006.01) |
| G02B 23/18 | (2006.01) |

(52) U.S. Cl.
CPC .............. *G02B 25/001* (2013.01); *G02B 7/04* (2013.01); *G02B 13/16* (2013.01); *G02B 23/125* (2013.01); *G02B 23/18* (2013.01); *H05K 9/0081* (2013.01)

(58) Field of Classification Search
CPC ...... G02B 23/00; G02B 23/12; G02B 23/125; G02B 23/18; G02B 7/04; G02B 7/12; G02B 27/18; G03B 21/00
USPC .................................................. 359/399–435
See application file for complete search history.

(56) References Cited

U.S. PATENT DOCUMENTS

| | | | |
|---|---|---|---|
| 3,737,667 A * | 6/1973 | Babb | H01J 31/506 |
| | | | 250/214 LA |
| 4,325,602 A | 4/1982 | Lange | |
| 4,924,080 A | 5/1990 | Caserta et al. | |
| 5,118,925 A * | 6/1992 | Mims | H01J 29/867 |
| | | | 174/382 |

(Continued)

OTHER PUBLICATIONS

International Search Report and Written Opinion, International Application No. PCT/US19/40636, dated Oct. 8, 2019.

(Continued)

*Primary Examiner* — Thong Q Nguyen
(74) *Attorney, Agent, or Firm* — Charles S. Sara; Elizabeth L. Neal; DeWitt LLP

(57) ABSTRACT

The present invention is a lightweight night vision device (NVD) sealed from environmental conditions, shielded from electromagnetic interference (EMI), and having mechanisms for easy adjustment and fixation of collimation and interpupillary distance. The NVD monocular housing is integrated with the eyepiece, image intensifier tube module, and objective, allowing collimation to be fixed via an optical alignment of the monocular housing to its eyepiece, tube module, and objective. Certain components from existing NVDs may be reused in assembling the present invention to provide cost savings.

30 Claims, 14 Drawing Sheets

(56) References Cited

U.S. PATENT DOCUMENTS

Figure 1A:
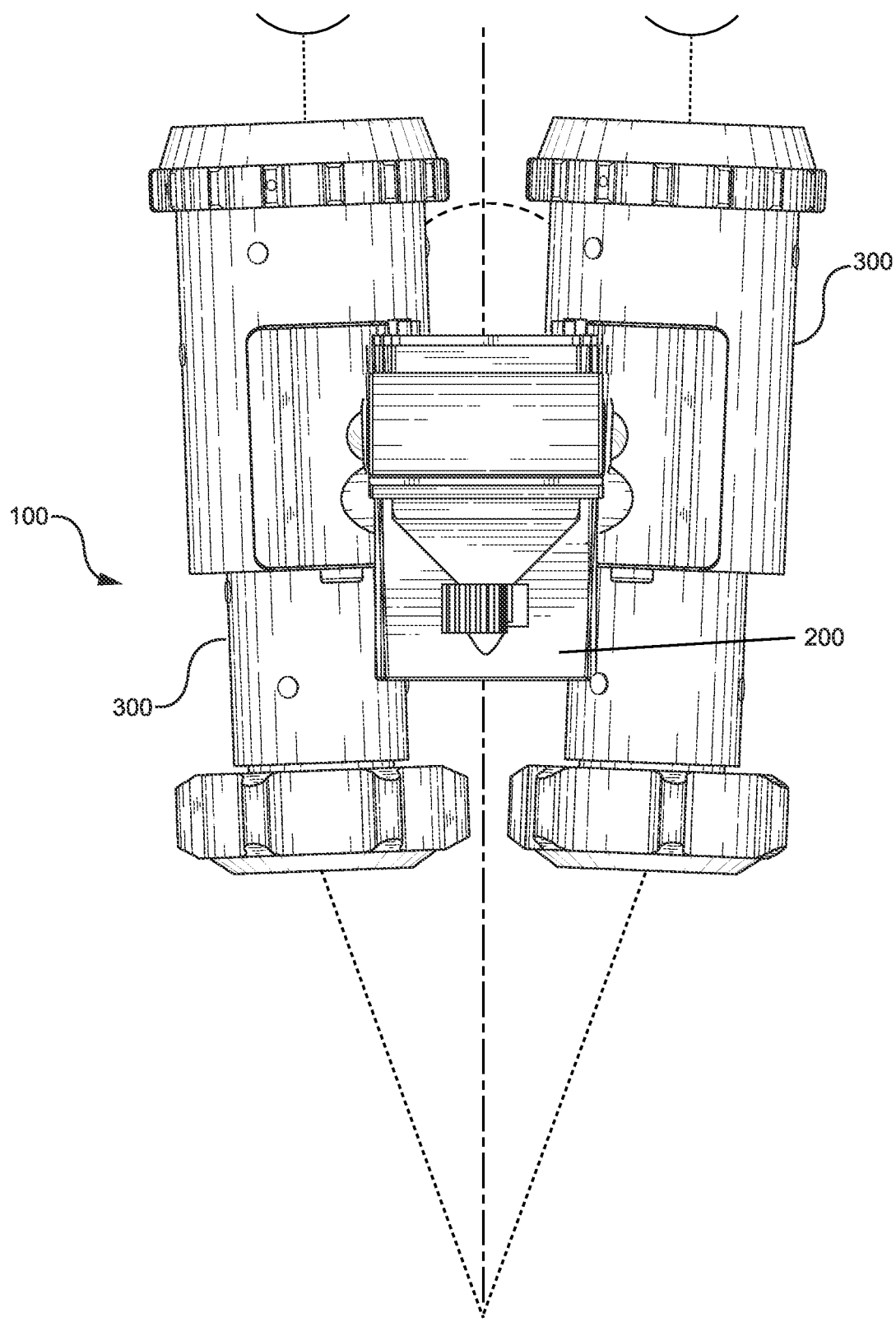
Figure 1B:
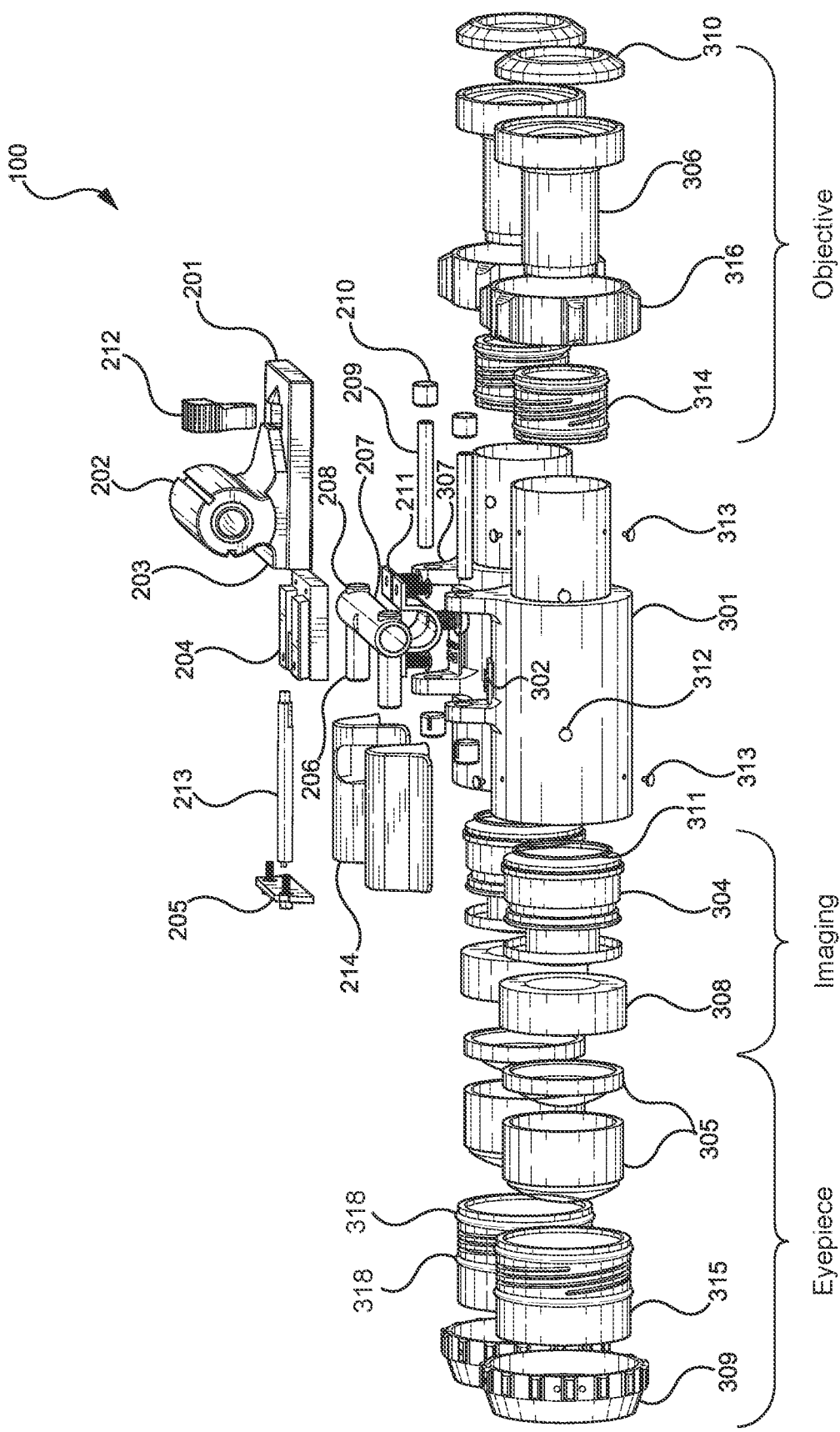
Figure 1C:
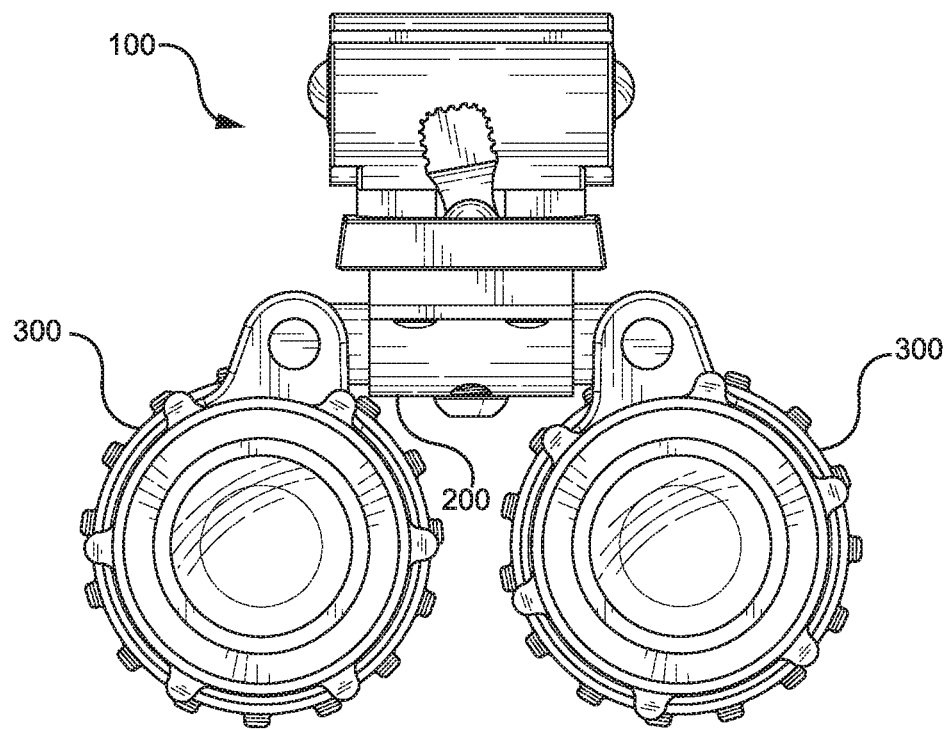
Figure 1D:
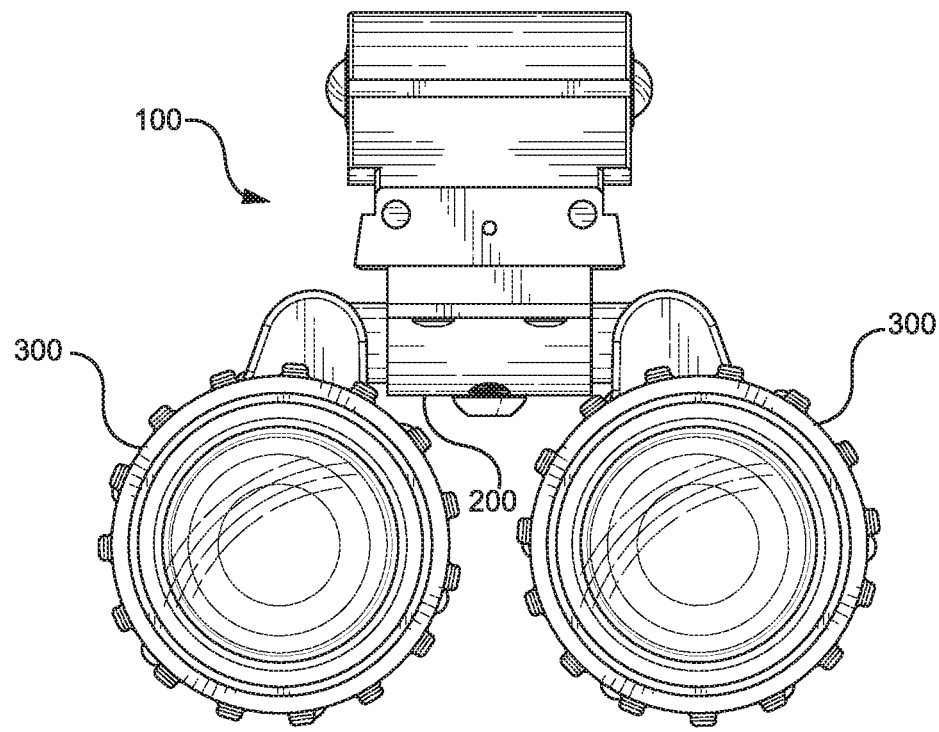
Figure 1E:
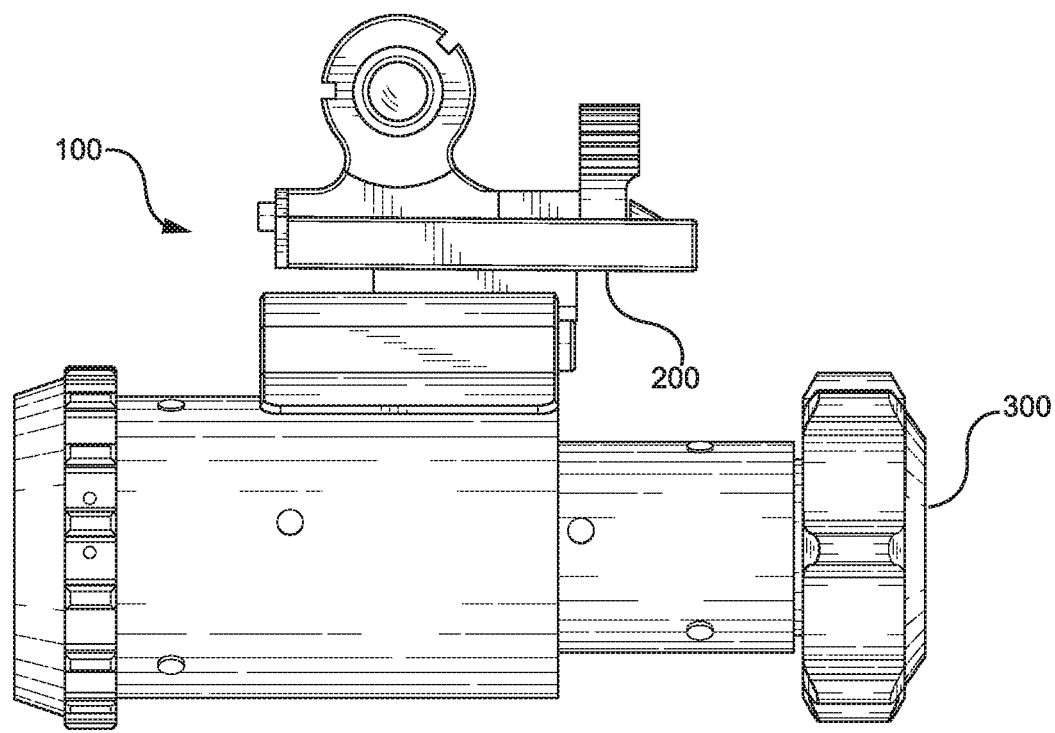
Figure 1F:
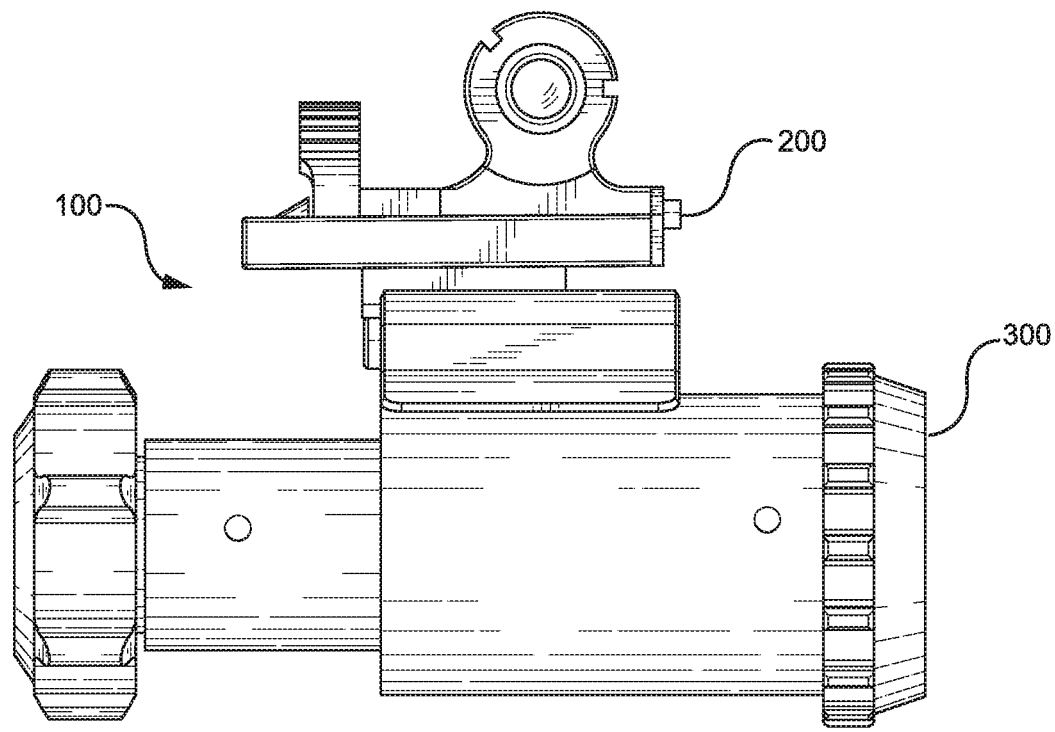

| | | | |
|---|---|---|---|
| 5,305,142 A * | 4/1994 | Phillips | G02B 23/12 |
| | | | 359/357 |
| 5,535,053 A | 7/1996 | Baril et al. | |
| 5,644,425 A | 7/1997 | Palmer | |
| 5,703,354 A | 12/1997 | Wannagot et al. | |
| 5,867,313 A * | 2/1999 | Schweitzer | G02B 23/125 |
| | | | 359/399 |
| 5,943,174 A | 8/1999 | Bryant et al. | |
| 6,150,650 A | 11/2000 | Bowen et al. | |
| 6,238,790 B1 | 5/2001 | Smith et al. | |
| 6,288,386 B1 | 9/2001 | Bowen et al. | |
| 8,313,608 B2 * | 11/2012 | Garris | G02B 23/12 |
| | | | 156/92 |
| 8,507,839 B2 * | 8/2013 | Adams | H01J 31/50 |
| | | | 250/214 VT |
| 2001/0022685 A1 | 9/2001 | Carmi et al. | |
| 2005/0056111 A1 | 3/2005 | Exely et al. | |
| 2007/0068058 A1 | 3/2007 | Remo | |
| 2012/0070119 A1 | 3/2012 | Hagen | |
| 2013/0083391 A1 | 4/2013 | Teetzel et al. | |

OTHER PUBLICATIONS

International Preliminary Report of Patentability, International Application No. PCT/US19/40636, dated Feb. 3, 2020.

Partial Supplemental Search Report dated Apr. 26, 2022, from the European Patent Office in connection with the European Application No. 19830180.6.

Extended Search Report dated Sep. 9, 2022, from the European Patent Office in connection with the European Application No. 19830180.6.

* cited by examiner

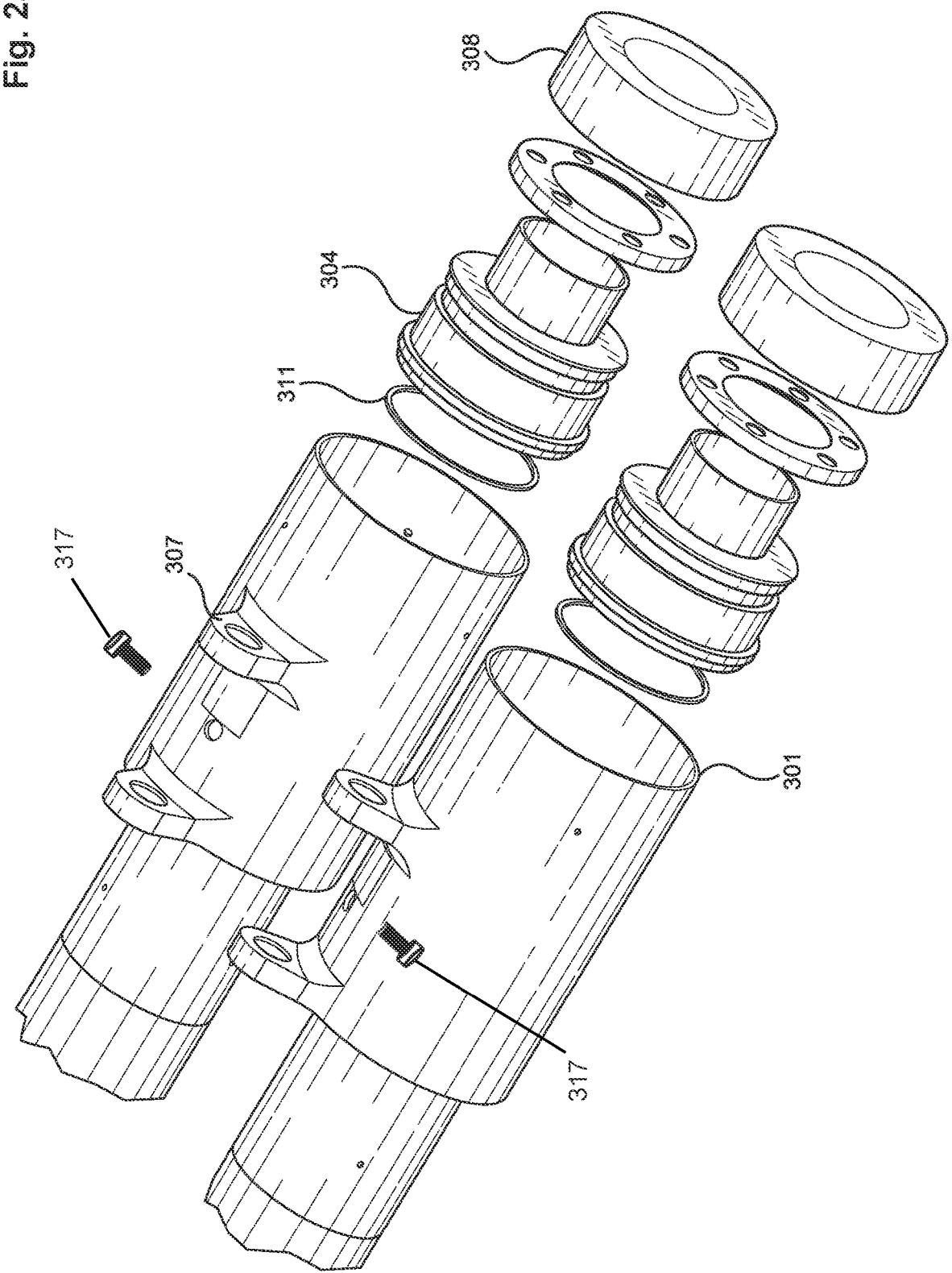

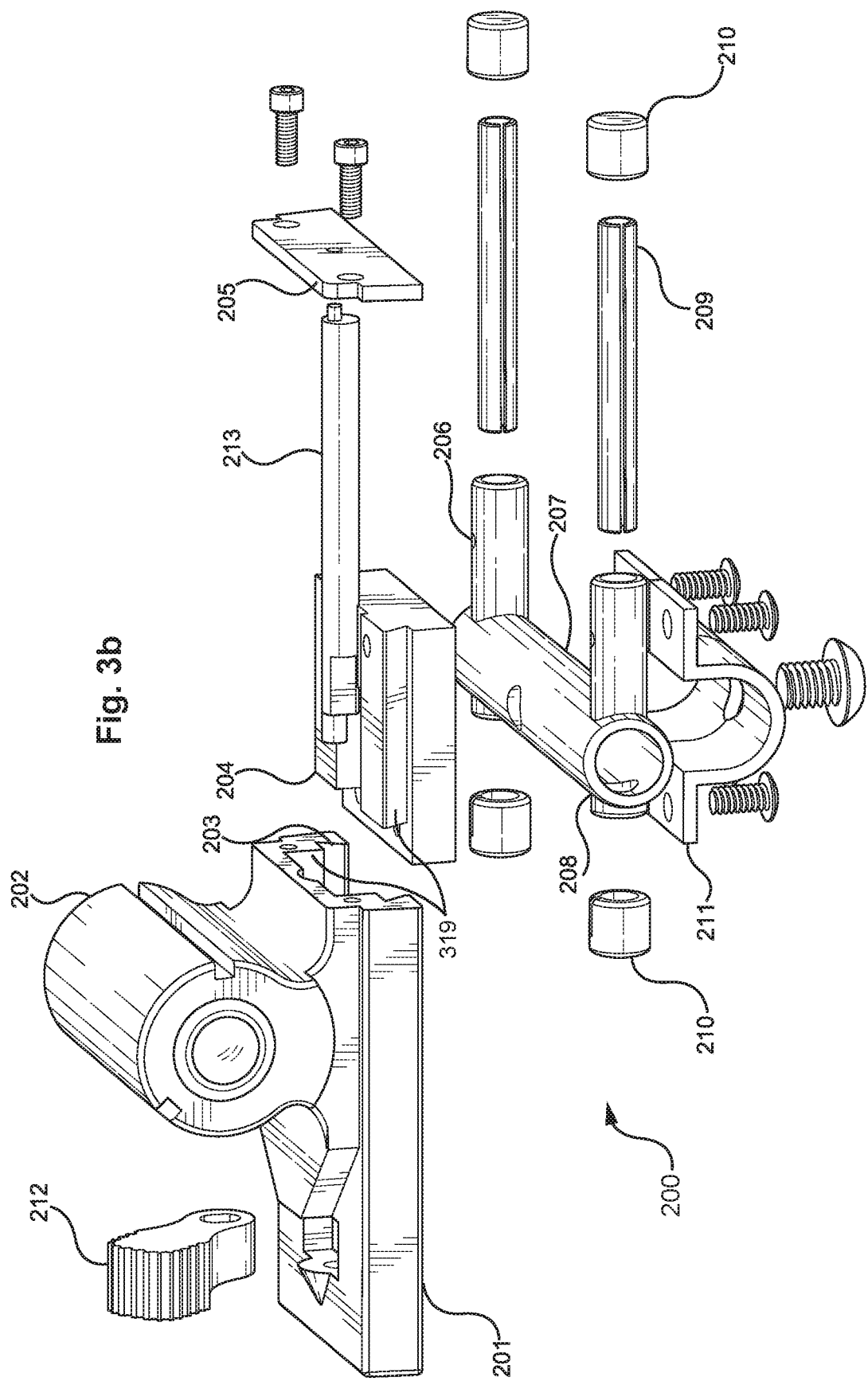

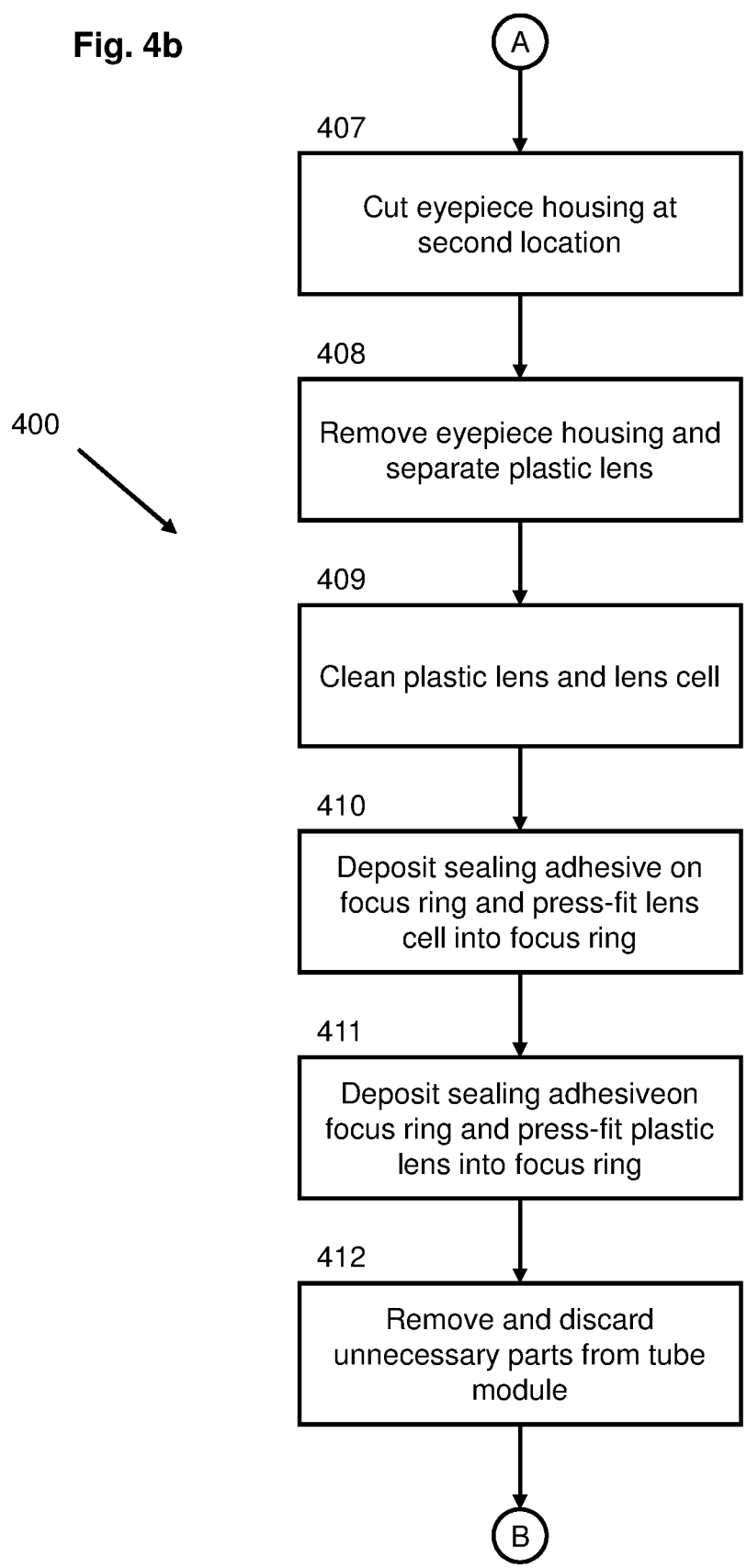

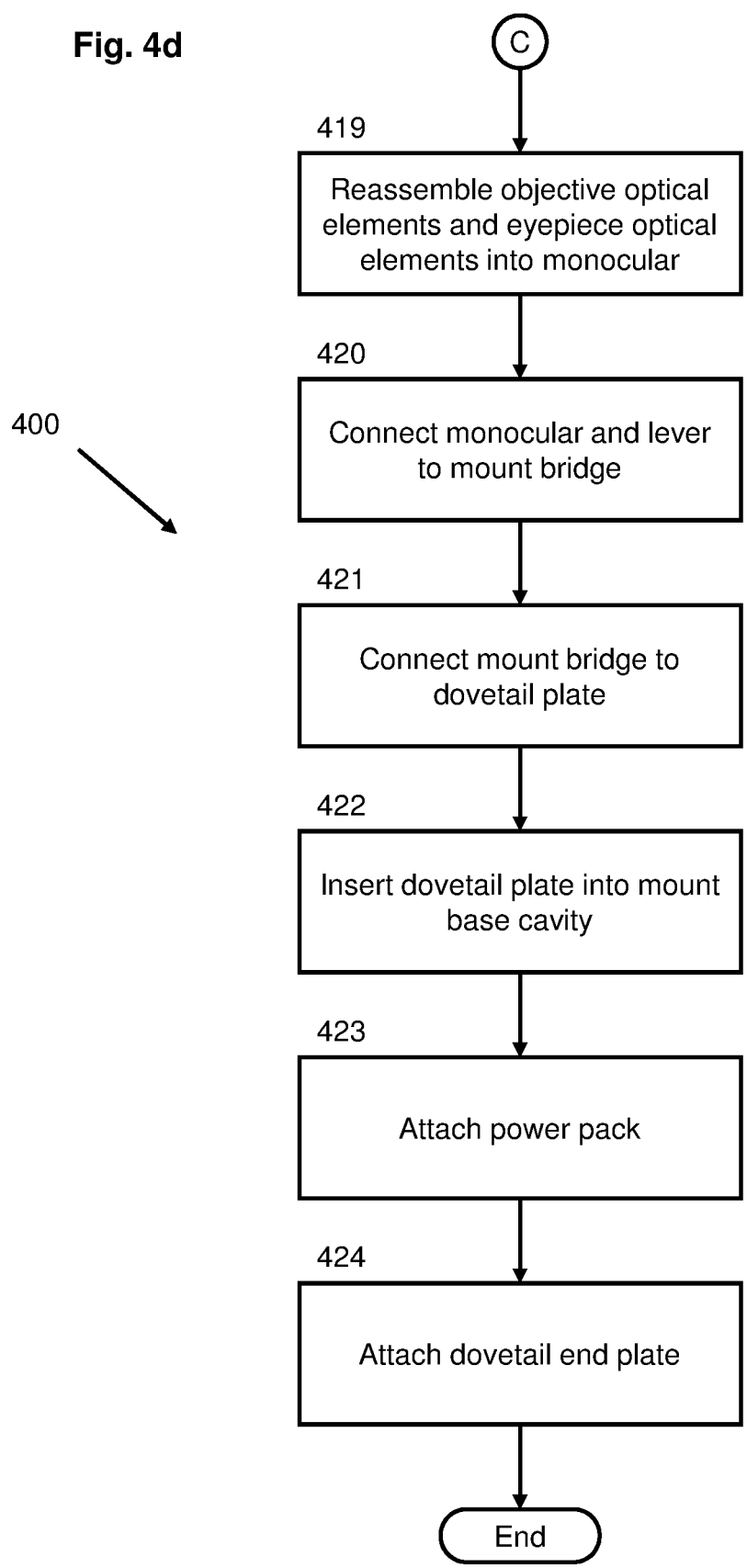

SYSTEMS AND METHOD FOR IMPROVED NIGHT VISION

CROSS-REFERENCE TO RELATED APPLICATIONS

This application claims the benefit of prior-filed, U.S. Provisional Patent Application No. 62/694,326, filed on Jul. 5, 2018, the contents of which are incorporated herein by reference in their entirety.

BACKGROUND OF THE INVENTION

The present application is directed to the field of imaging. More specifically, the present application is directed to the field of military and commercial night vision devices and systems that require a minimum of both size and weight to be implemented with required effect.

Generally, the term night vision can refer to two very different technologies. The first, which amplifies ambient visible and/or near infrared light, is commonly termed "image intensification." The second technology, which detects and images the light emitted from thermal sources, is commonly termed "thermal vision." The technology that the art described herein pertains to is that of image intensification. Image intensification has been available to the U.S. military for approximately 50 years and has been available, generally, to commercial applications such as aviation and security for approximately 30 years. Image intensification technology has therefore had much time to mature and evolve to meet the needs of military and commercial marketplaces. Image intensification devices are normally called "tubes" because, like old cathode ray tubes, they require the containment of a vacuum within a tube to operate. These tubes also require very high voltages, in excess of 1000 VDC. This high voltage power supply is normally integrated, or packaged, into the tube. When the image intensifier exists without its packaged power supply, it is referred to as a "tube module."

Any night vision system or device must provide a consistent and stable supply of power to the tube, optics that present images to the input of the tube, and optics that project images from the output of the tube. All of these elements, as well as shockproof and waterproof system properties, must be provided to form a night vision device. Given these obstacles to simplification, improving the size and weight of night vision devices and systems has been a major area of focus in the evolution of tube technology. Millions of dollars have been spent by both governments and corporations to reduce the complexity and footprint posed by night vision devices and systems.

The biggest leap in reducing the size and weight of night vision devices and systems was made in the 1980s by the U.S. military and certain systems manufacturers. The goal was to greatly reduce the size and weight of night vision goggles used primarily in aviation. All aspects of an aviation night vision goggle had to be redesigned: tubes, binoculars and optics, mounting apparatus, and power systems. The result of the significant redesign was the Aviator Night Vision ("ANVIS") tube and aviation goggle design, simply referred to as the ANVIS design. This design was from the beginning very successful and is, at the time of this application, the standard in aviation night vision. It has many copies and clones currently available to military and commercial customers.

Prior attempts at improving the ANVIS design and other night vision devices include light weight night vision devices manufactured using different polymers, but it does not teach the potting of an image intensifier tube module within the housing of monocular, nor does it teach the collimation of night vision goggles. Such an ultra-lightweight and newly integrated night vision device has not been used in the field of military or commercial ground, marine, or air night vision product design and manufacturing. ANVIS and similar night vision devices are being manufactured and in use around the world, but existing night vision devices are not known to have an integrated/potted monocular housing with image intensifier tube module that can be collimated and removably affixed to a helmet mount.

There is an unmet need in the art for an integrated/potted monocular housing with image intensifier tube module that can be collimated and removably affixed to a helmet mount containing an image intensifier tube power supply.

BRIEF SUMMARY

An embodiment of the present invention is a monocular device for a night vision device. The monocular device comprising a monocular housing, an eyepiece optical element, an objective optical element, and a tube module. The monocular housing is made from a conductive material and has at least one mounting feature extending along an outer surface of the monocular housing. An optical axis of the monocular housing is aligned in parallel with the mechanical axis of the at least one mounting feature. The eyepiece optical element has an eyepiece focus ring slidably connected to the monocular housing by at least one focus mechanism. The objective optical element has an objective focus ring slidably connected to the monocular housing by at least one focus mechanism. The tube module has a tube power supply and insulative material shielding the tube module from the rest of the monocular. An optical axis of the tube module is aligned in parallel with the mechanical axis of the at least one mounting feature.

Another embodiment of the present invention is a night vision device. The device has a monocular mounting system interconnecting two of the above monoculars using a cross beam. The cross beam is a mount bridge having a first monocular bridge at a first end and a second monocular bridge at a second end. Each monocular is attached to either the first monocular bridge or second monocular bridge such that the two monoculars extend at a first fixed angle to each other and at a second fixed angle to an observer's eyes such that both monoculars are optically aligned to a fixed point in space in front of the device.

Another embodiment of the present invention is a method of making the above night vision device by retrofitting existing parts. The method removes at least one eyepiece optical element, stripping mechanical housings from the at least one eyepiece optical element, and rebuilding the at least one eyepiece optical element with the focus mechanisms described above. The method removes at least one objective optical element, stripping mechanical housings from the at least one objective optical element, and rebuilding the at least one objective optical element with the focus mechanisms described above. The method removes at least one tube, stripping the at least one tube to a tube module and a power supply and repotting the tube module in at least one monocular housing described above. The method repots the at least one eyepiece optical element and at least one objective optical element to the at least one monocular housing. The method removes an existing monocular mounting system and mounts the at least one monocular housing to the monocular mounting system described above.

BRIEF DESCRIPTION OF THE DRAWING(S)

FIGS. 1a, 1b, 1c, 1d, 1e, and 1f are, respectively, top, exploded, front, back, right, and left views of the improved night vision device.

Figure 2B:
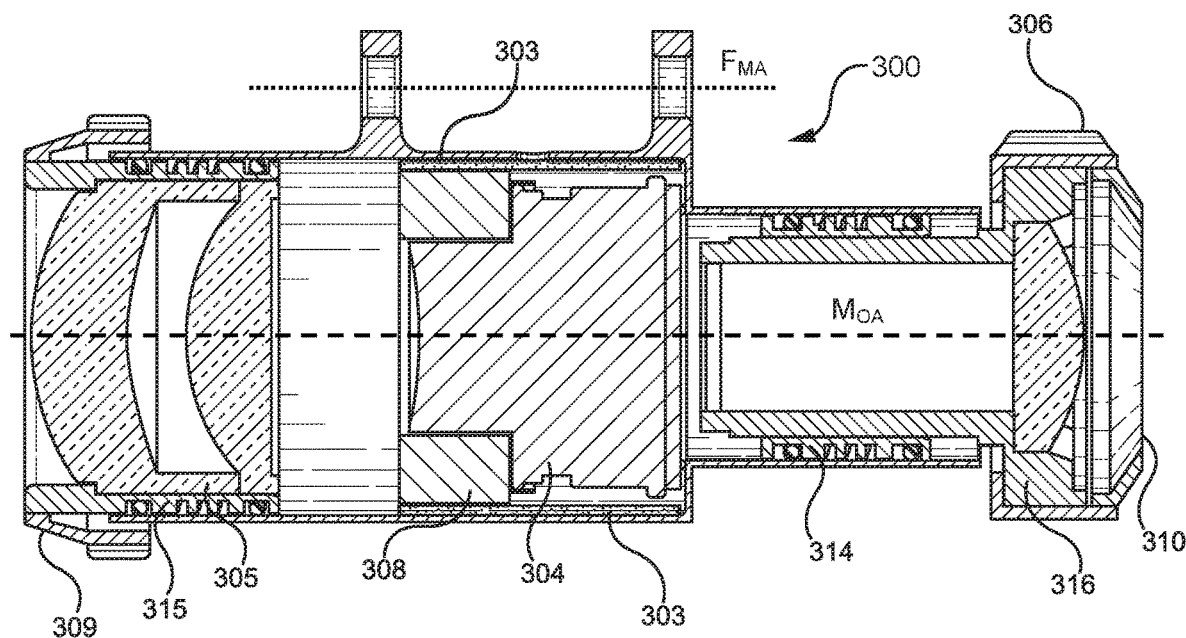
Figure 2C:
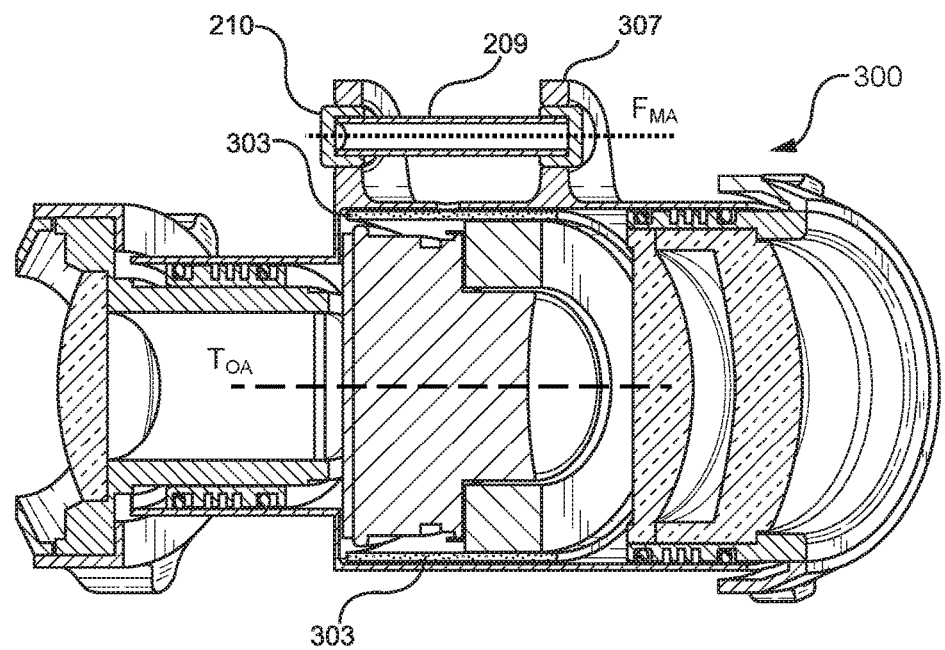
Figure 3A:
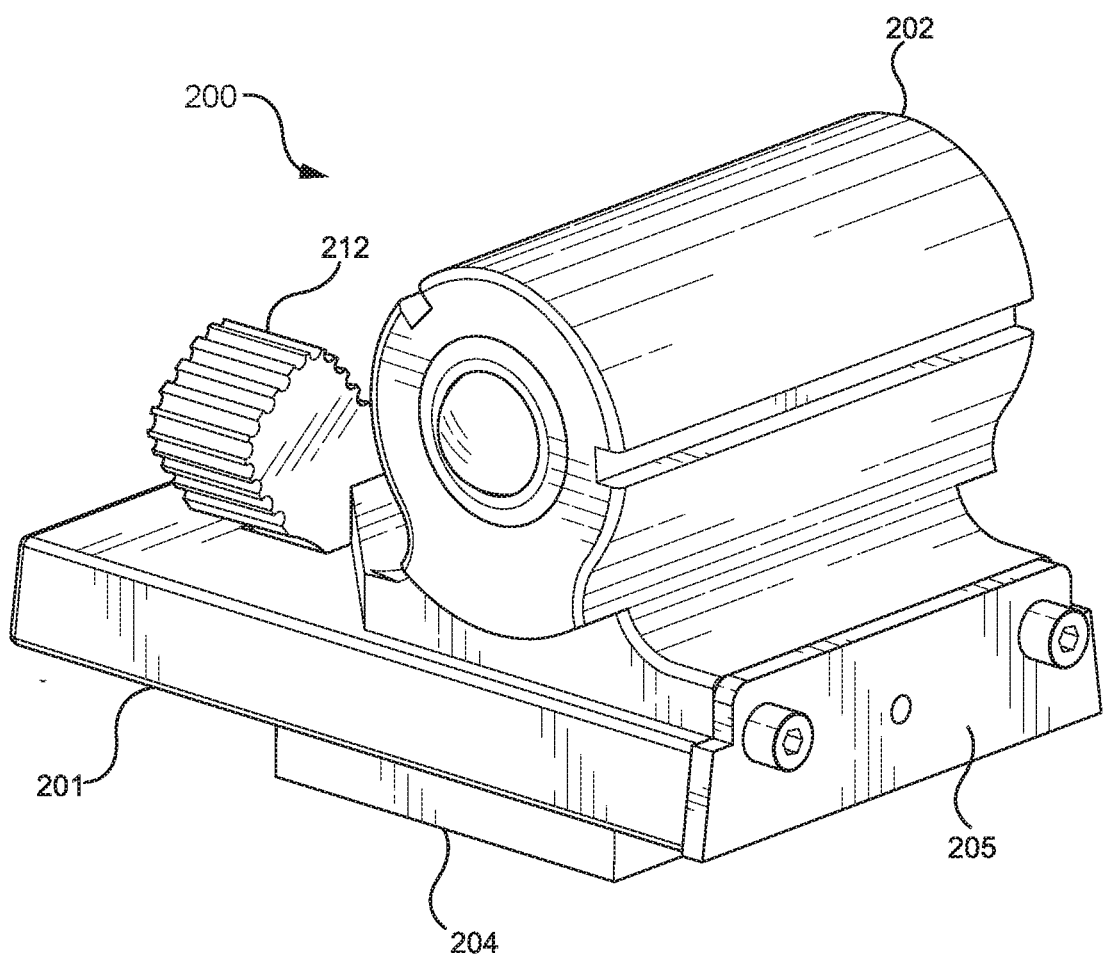
Figure 3C:
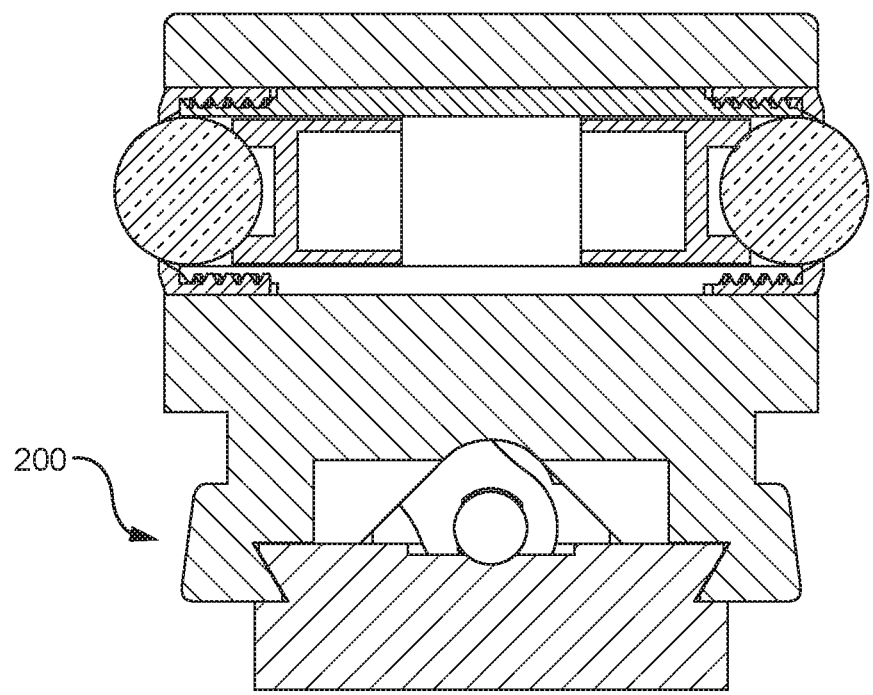
Figure 3D:
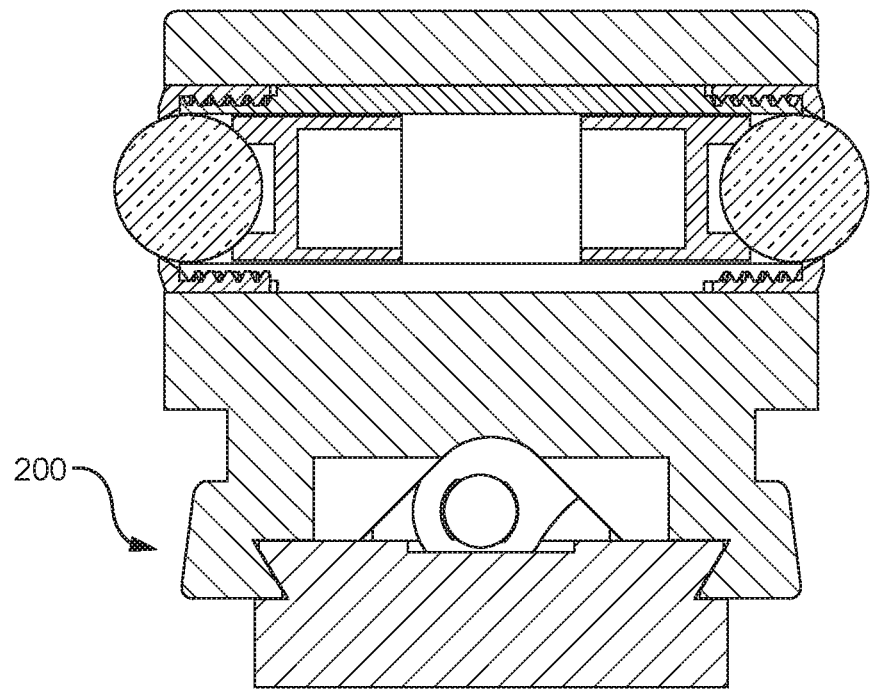
Figure 3E:
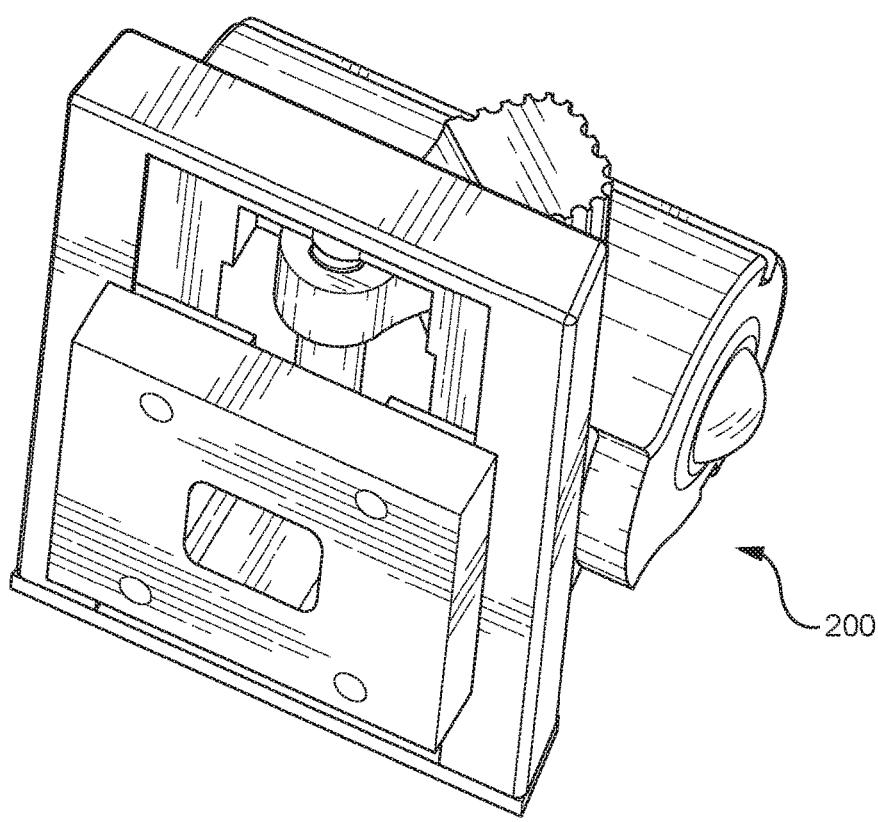
Figure 3F:
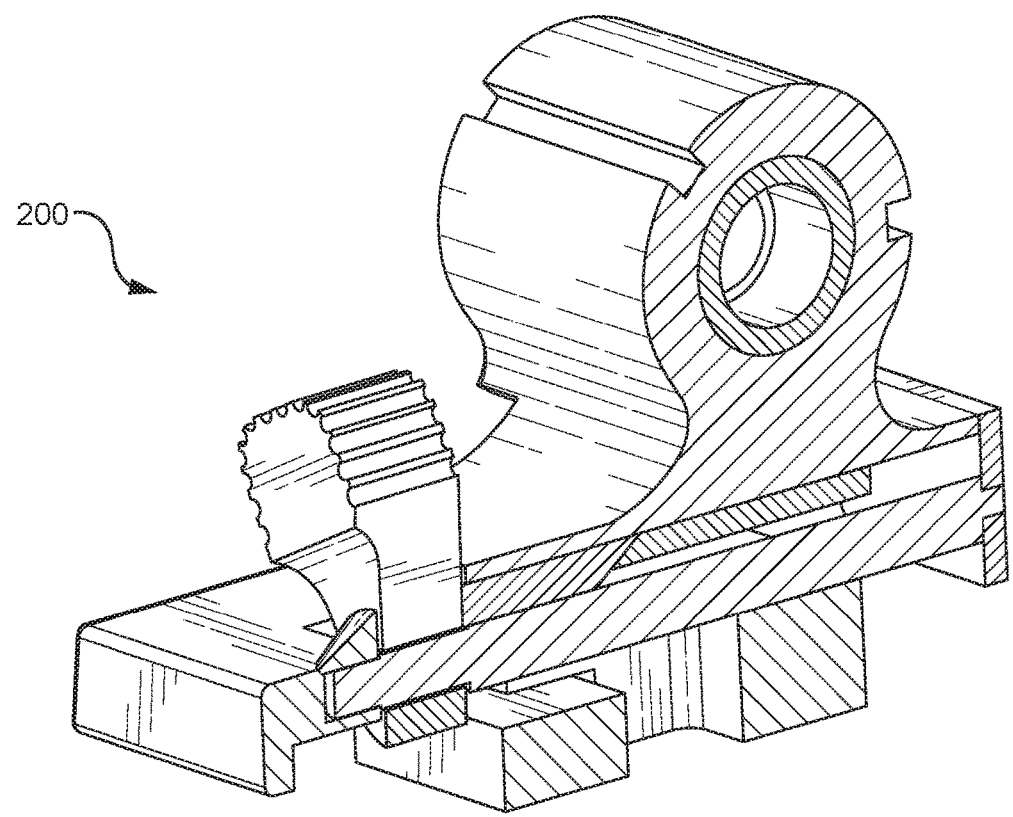
Figure 4A:
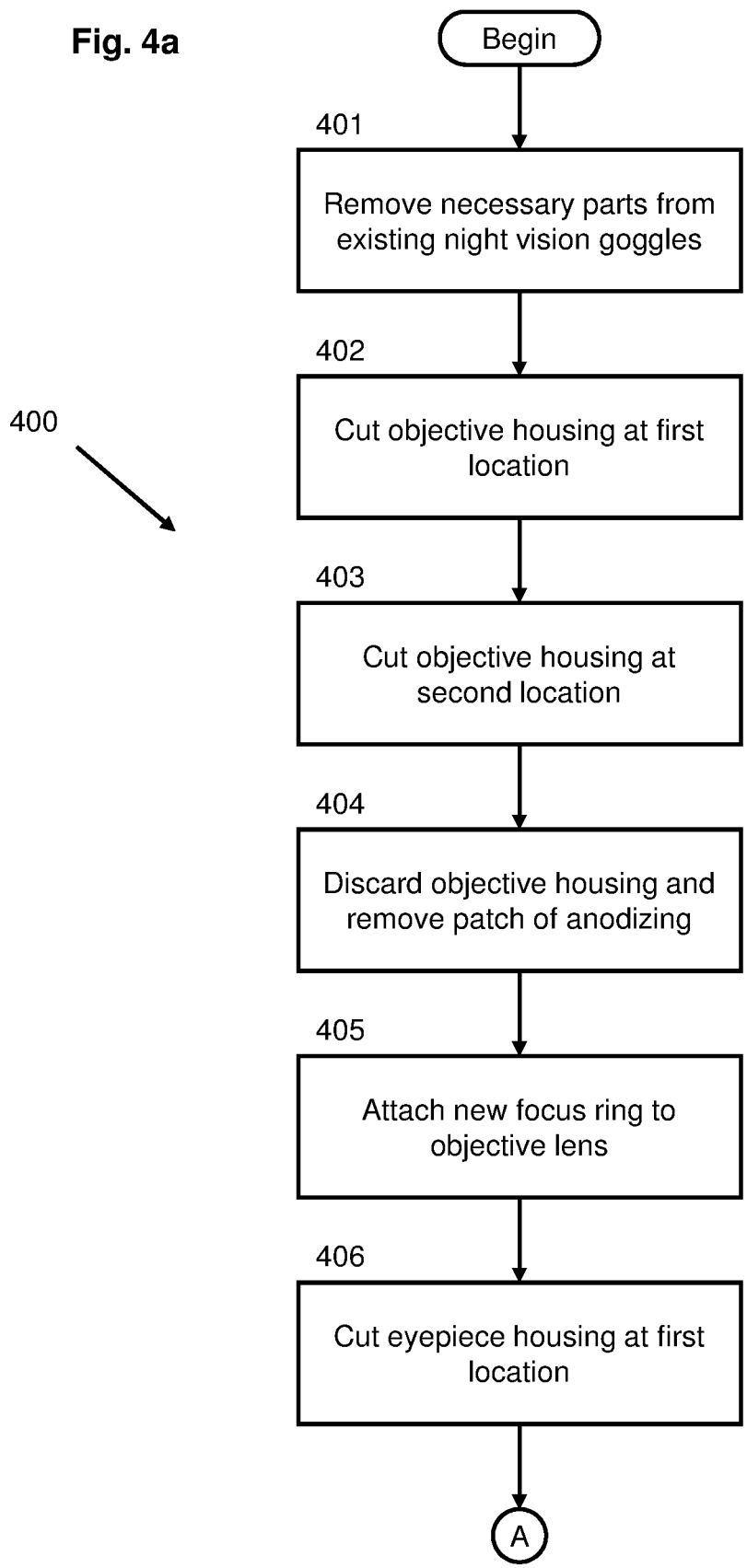
Figure 4C:
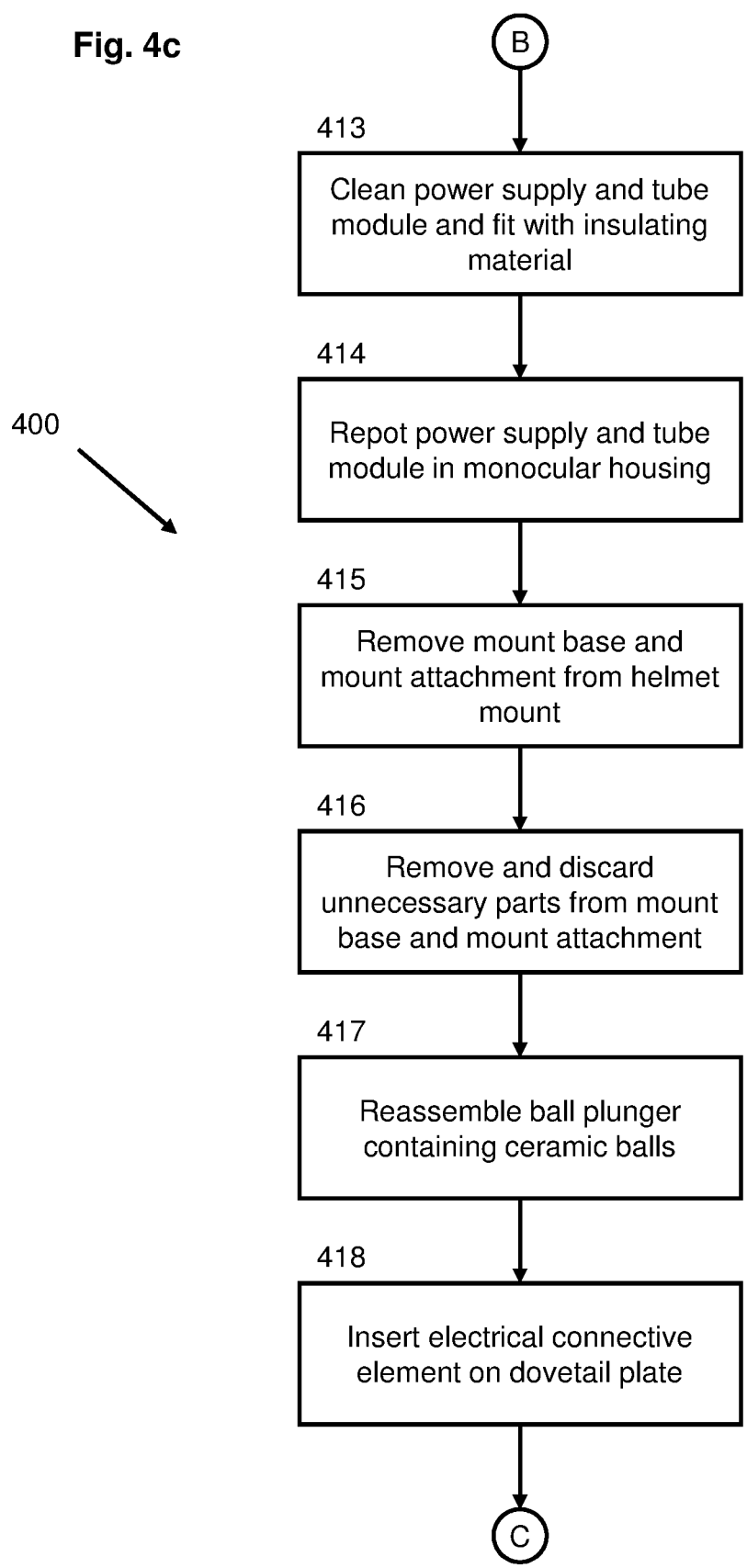

FIGS. 2a, 2b, and 2c are, respectively, partial exploded, side cross-sectional, and oblique cross-sectional views of a monocular of the improved night vision device.

FIGS. 3a, 3b, 3c, 3d, 3e, and 3f are, respectively, top, exploded, cross-sectional, cross-sectional, bottom, and oblique cross-sectional views of a monocular mounting system of the improved night vision device.

FIGS. 4a, 4b, 4c, and 4d are a flowchart of a method for constructing an improved night vision device from an existing night vision device.

It should be understood that for clarity, not every part is labeled in every drawing. Lack of labeling should not be interpreted as a lack of disclosure.

DETAILED DESCRIPTION OF THE INVENTION

In the present description, certain terms have been used for brevity, clearness and understanding. No unnecessary limitations are to be applied therefrom beyond the requirement of the prior art because such terms are used for descriptive purposes only and are intended to be broadly construed. The different systems and methods described herein may be used alone or in combination with other systems and methods. Dimensions and materials identified in the drawings and applications are by way of example only and are not intended to limit the scope of the claimed invention. Any other dimensions and materials not consistent with the purpose of the present application can also be used. Various equivalents, alternatives and modifications are possible within the scope of the appended claims. Each limitation in the appended claims is intended to invoke interpretation under 35 U.S.C. § 112, sixth paragraph, only if the terms "means for" or "step for" are explicitly recited in the respective limitation.

A more particular description of the invention briefly summarized above is available from the exemplary embodiments illustrated in the drawing and discussed in further detail below. Through this reference, it can be seen how the above cited features, as well as others that will become apparent, are obtained and can be understood in detail. The drawings nevertheless illustrate only typical, preferred embodiments of the invention and are not to be considered limiting of its scope as the invention may admit to other equally effective embodiments.

FIGS. 1a, 1b, 1c, 1d, 1e, and 1f illustrate various views of the improved night vision device 100 including a monocular mounting system 200 and two monoculars 300. Any part of the device 100 may include weight reduction pockets cut in a patterned configuration as long as the performance of that part would not be affected by such a pocket. The patterned configuration may include, but is not limited to, a triangular lattice, a parallelogrammic lattice, a trapezoidal lattice, a conventional "honeycomb" or hexagonal lattice, any combinations and/or spacings of multiple different shapes, and/or any other regular or irregularly shaped and/or spaced patterns. The patterned configuration may be limited to a surface depth which does not perforate a thickness of material, and/or may fully and/or partially perforate a thickness of material. An identification indicium may be anodized or otherwise inscribed on any metal surface of the device 100. The device 100 contains high strength-to-weight ratio materials such as, but not limited to, titanium, aluminum, magnesium, high-strength steel alloys, high-strength polymers, fiber composites, hybrid composites, composites incorporating a nano-crystal and/or nano-element matrix, metamaterials, and any combination thereof.

The major components of the monocular mounting system 200 are a mount slide 201, a mount attachment 202, a slide cavity 203, a dovetail plate 204, a dovetail end plate 205, a cross beam 208 incorporating a monocular bridge 206 and a mount bridge 207, two bridge pins 209, a pair (fore/aft) of pin end bushings 210 for each monocular bridge pin 209, and a bridge clamp 211. At least one lever 212 is connected to a non-cylindrical cam pin 213 as shown in FIGS. 3a through 3f. An electrical shroud 214 covers the connection between each monocular 300 and the system 200 and provides additional electromagnetic interference (EMI) shielding.

The major components of each monocular 300 are a monocular housing 301, EMI filter 302, insulating material 303, an image intensifier tube module, or tube module, 304, an eyepiece optical element 305, an objective optical element 306, tube power supply 308, an eyepiece focus adjustment ring 309, an optional objective shroud 310, a signal reducing means 311, at least one tube purge mechanism 312, focus mechanisms 313, an objective focus ring 314, an eyepiece focus ring 315, an objective focus adjustment ring 316, and optional tube alignment screws 317. While the embodiment shown includes a right monocular housing 301, the improved night vision device design provides for embodiments with right eye, left eye, or left+right concurrent configuration and operation.

The mount slide 201 is a shell around slide cavity 203, which in turn surrounds a fore-and-aft sliding dovetail plate 204. At least one dovetail end plate 205 is attached to mount slide 201 to prevent loss of the dovetail plate 204 from slide cavity 203. A friction fit between the dovetail plate 204 and the cam pin 213 maintains fore-and-aft positioning of the monoculars 300. In certain embodiments, a tube power supply may be located within the mount slide 201 with high voltage wires running down the cross beam 208 to the monoculars 300. In certain embodiments, the dovetail plate 204 includes a sliding electrical interface 319 including a set of electrical traces and/or contacts. Such electrical traces and/or contacts interact with complementary electrical traces and/or contacts mounted in the mount slide 201. It should be noted that the sliding electrical interface 319 is distinct from the optional tube power supply and high voltage wires; in certain embodiments, both may be used together.

The mount attachment 202 is a hollow ball plunger including four shielded voltage wires connected to ball plunger leads. These voltage wires extend through at least one aperture in the dovetail plate 204. Mount attachment 202 allows a rotating connection to a user's helmet (not shown), permitting monoculars 300 to be tilted or rotated out of position when not needed. A friction fit between the mount attachment 202 and the user's helmet maintains tilt positioning of the monoculars 300.

The system 200 secures the one or more monoculars 300 via a cross beam 208 which maintains two features: the mount bridge 207 and the monocular bridges 206. The monocular bridge 206 and the mount bridges 207 are physical and functional features of a single element, the cross beam 208 which enables a number of functions to exist within a single element. This unique arrangement allows for the advanced feature of supporting and shielding wiring and other components for tube module 304 while providing monocular fore/aft adjustment, alt/azimuth adjustment, interpupillary distance adjustment, and weight reduction. While the monocular bridge 206 and the mount bridges 207 are cylindrical or tapering hollow structures in the embodiment shown in FIGS. 1b and 3b, the monocular bridge 206 and the mount bridges 207 may be any features which allow connection of another component to the cross beam 208 or vice versa. The cross beam 208 is also conductively connected to each monocular housing 301.

The mount bridge 207 separates the monoculars 300 a fixed distance from each other and may act as a pivot for providing tilt adjustment of up to 360 degrees of the monoculars 300 in relation to the user; in certain embodiments, the tilt allowed is less than 360 degrees. The monocular bridges 206 are disposed at opposite ends of the mount bridge 207 and point in directions that will set the monoculars 300 at a first fixed angle to each other and at a second fixed angle to the observer's eyes. The monocular bridges 206 are deliberately angled to point at a fixed distance in front of the device 100 to provide increased depth perception, and to prevent eyestrain due to optical divergence. Both monoculars 300 are optically aligned to a fixed point in space in front of the device 100.

The cross beam 208 of the exemplary embodiment has an approximately I- or U-shaped configuration, interconnecting the two monocular bridges 206 with the mount bridge 207. Both the monocular bridges 206 and the mount bridge 207 may have a tapered, hollow, internal truss, and/or patterned configuration to reduce weight. Cross beam 208 is made from lightweight, rigid material, such as, but not limited to, titanium. The hollow structure both reduces weight and allows passage of volt wires therethrough while providing EMI shielding. In certain other embodiments, cross beam 208 has any configuration supporting a beam with two ends that extend at approximately 90 degrees to the beam longitudinal axis.

The monocular mounting system 200 connects to the monoculars 300 via the monocular bridge pin 209 that runs through the monocular bridge 206 and the monocular housing 301, fastened by two pin end bushings 210 fore and aft. The monocular bridge pin 209 couples the monocular mounting system 200 to the monocular 300 in a unique configuration allowing full swing interpupillary distance (IPD) adjustment. A friction fit between the monocular housing 301, monocular bridge pin 209, and the pin end bushings 210 maintains IPD positioning of the monoculars 300. Moreover, the monocular bridge 206 includes a designed-in collimation angle converging in the field of view in front of the device 100 to increase depth perception. In certain embodiments, collimation and IPD adjustment may be made by removing pin end bushings 210 and adjusting the position of the monoculars 300. One or both of the monoculars 300 may be rotated about the mechanical axis of the mounting feature 307 to remove them from a user's field of view; as a consequence, the device may be used binocularly, monocularly, or without any intensified imagery (both monoculars 300 removed from the user's field of view).

The monocular bridge 206 is connected to the dovetail plate 204 using bridge clamp 211 and/or threaded attachment members. Monocular bridge 206 interconnects the two mount bridges 207 and features at least one aperture therethrough to allow passage of electrical wires. Bridge clamp 211 has a U-shaped configuration which receives the monocular bridge 206 and side flanges which are connected to the dovetail plate 204. Certain embodiments may use multiple bridge clamps 211 instead of a single bridge clamp 211. Certain embodiments may also utilize a slot and pin to fix the rotational range.

Each mount bridge 207 serves to rotatably connect a monocular 300 to monocular mounting system 200 via a monocular bridge pin 209. Mount bridge 207 extends between mounting features 307 protruding from the monocular housing 301, with the monocular bridge pin 209 passing through both the mount bridge 207 and the mounting features 307. While the embodiment shown in FIG. 1b has two mounting features 307 extending along an outer surface of the monocular housing 301, other embodiments may have more or fewer mounting features 307. An optical axis ($M_{OA}$) of the monocular housing 301 is aligned in parallel with the mechanical axis ($F_{MA}$) of the mounting feature 307. The monocular 300 may be rotated about the mechanical axis of the mounting feature 307. Monocular bridge pin 209 is a hollow cylinder having a length greater than a length of mount bridge 207.

In certain embodiments, the pair of fore and aft pin end bushings 210 for each monocular bridge pin 209 extend over the fore and aft ends, respectively, of each monocular bridge pin 209. Each pin end bushing 210 is a round slab with a C-shaped stem extending from one side. The C-shaped stem forms a friction fit when inserted in the annular space between the monocular bridge pin 209 and the mounting feature 307 of monocular housing 301 to fix collimation of the two monoculars 300. In certain other embodiments, at least one pin end bushing 210 may be an irregularly- or regularly-shaped cam which does not form a friction fit. Such pin end bushings 210 are rotated to collimate the two monoculars 300 and then fixed in place. Pin end bushings 210 are manufactured from a polymer, or any similar lightweight material known in the art and capable of connection to mount bridge 207 via interference fit.

The monocular housing 301 is made from a conductive material to serve as a high voltage tube envelope; such materials may include, but are not limited to, metal. The monocular housing 301 includes electrical contacts to the tube power supply 308 and to the lens mechanisms via focus mechanisms 313, grounding to the monocular housing 301 thus providing EMI shielding to the whole monocular 300. In the embodiment shown in FIG. 1b, the focus mechanisms 313 are pins, though other mechanisms such as, but not limited to, threads, are contemplated. In certain embodiments, an area on the monocular housing 301 can be plated with conductive material to ensure proper grounding and connection to the EMI filter 302. At least one EMI filter 302 is mounted and conductively connected to the monocular housing 301.

Certain embodiments also may ground the cross beam 208 to the monoculars 300 by electrical conduction through pin end bushings 210 made from conductive material or by direct interconnection of the EMI filter 302 and the cross beam 208 via conductive wires. The resultant EMI shield extends from the cross beam 208 to the EMI filters 302 to the monocular housings 301 to the objective focus rings 314 and eyepiece focus rings 315 through the focus mechanisms 313. This shielding provides a complete Faraday electrical shield for the electrical components to the night vision device 100. It should also be noted that additional EMI filters 302 may be inserted in the cross beam 208 if additional filtering is required.

The complete electrical shield surrounds all electrical components of the device 100. The eyepiece optical elements 305 are conductively connected to the monocular housings 301. The monocular housings 301 are conductively connected to the mounting features 307. The mounting features 307 are conductively connected to the cross beam 208. The cross beam 208 is conductively connected to the dovetail plate 204. The dovetail plate 204 is conductively connected to the mount slide 201.

The monocular housing 301 may be anodized and/or alodyned in certain areas for electrical insulation/conduction purposes, i.e. insulating from the tube power supply 308 but conductive to prevent electromagnetic interference (EMI). The insulating material 303 located in monocular 300 electrically isolates the tube module 304 from the rest of monocular 300 to prevent high voltage breakdown. Embodiments may incorporate a sheet or applied coating of high-voltage insulating material 303 around the tube module 304, between the tube module 304 and the monocular housing 301, encapsulating the tube module 304. If the tube power supply 308 is located with the tube module 304, the tube power supply 308 may be encapsulated as well. Other embodiments do not specifically encapsulate the tube module 304 or tube power supply 308, but simply locate the insulating material 303 between the tube module 304 (and tube power supply 308 if applicable) and the rest of the monocular 300. In certain embodiments, the monocular 300 also includes tube alignment screws 317 which are used to hold the tube module 304 in place during assembly of the monocular 300.

Each tube module 304 may include a tube power supply 308 integrated with the tube module 304. An optical axis ($T_{OA}$) of each tube module 304 is also optically aligned in parallel with the mechanical axis ($F_{MA}$) of at least one mounting feature 307. The tube power supply 308 power supply may be located at the base of the monocular mounting system 200 to reduce its contribution to the moment of inertia relative to the head of a user. In certain embodiments, the tube module 304 includes at least two tube purge mechanisms 312 to purge gases from each side of the tube module 304 to ensure the vacuum required for proper functioning of tube module 304. The tube purge mechanisms 312 extend through the monocular housing 301, and are generally located at opposite ends of tube module 304.

In certain embodiments, the tube module 304 also includes a signal reducing means 311 for adjusting tube electro-optical performance via reduction of incoming light signal. The signal reducing means 311 may include a glass disk disposed in front of a glass input window of the tube module 304, a filter deposited on a glass disk that absorbs incoming light energy in the spectral band of intensified night vision, and a disk glued in such a manner that it is not removable from the tube module 304.

Both the eyepiece optical element 305 and the objective optical element 306 include focus mechanisms which function as both focus mechanisms and EMI shield, and eliminate collimation adjustment. The objective focus ring 314 and the eyepiece focus ring 315 slide along focus mechanisms 313 as they are rotated using the eyepiece focus adjustment ring 309 and the objective focus adjustment ring 316, respectively, moving within the monocular 300 to provide optical focus. The objective focus ring 314 and eyepiece focus ring 315 are centered within the monocular housing 301 and held in alignment with the tube module 304 by circular springs 318. In certain embodiments, the circular springs 318 are O-ring seals.

The outer surfaces of the objective focus ring 314 and the eyepiece focus ring 315 may be at least partially coated with conductive material to make an electrical connection with the focus mechanisms 313. Because double O-ring seals 318 mate the objective focus ring 314 and the eyepiece focus ring 315 to the monocular housing 301, both sealing the objective focus ring 314 and the eyepiece focus ring 315 to the monocular housing 301 and keeping the lens axis parallel to the monocular housing 301, this is effectively the only conductive path. This allows the eyepiece optical element 305 and the objective optical element 306 to form an electrically conductive connection with the monocular housing 301, and from there to the EMI filter 302. This provides grounding and provides robust EMI shield for the device 100.

The eyepiece focus adjustment ring 309 and the objective focus adjustment ring 316 may include with finger contours for easier adjustment. The eyepiece focus adjustment ring 309 may have a tapering profile which conceals it from the user's line of sight. The objective optical element 306 can also include an attached objective shroud 310 located on an outer end of the objective optical element 306 to protect the tube module 304 from peripheral light which may render the image obtained unusable.

FIGS. 3a through 3f show the monocular mounting system 200. The lever 212 extends around non-cylindrical cam pin 213 and through mount slide 201, terminating in a ridged, enlarged tab for ease of grasping by a user. The lever 212 is a finger actuated cam mechanism that locks the dovetail plate 204 in position after adjustment. Because non-cylindrical cam pin 213 rotates about a non-central axis, part of the cam pin 213 rotates into contact with the dovetail plate 204, the frictional interface between the cam pin 213 and the dovetail plate 204 preventing fore-and-aft movement of the dovetail plate 204. To adjust the fore-and-aft positioning of the monoculars 300, the user may rotate lever 212 until the cam pin 213 and the dovetail plate 204 are no longer in contact, then move the dovetail plate 204.

FIGS. 4a through 4d are a flowchart of a method 400 for constructing an improved night vision device from an existing night vision device, as the above monocular design can be manufactured directly or can be implemented using existing ANVIS tubes, which are very expensive at approximately US$3,000 each. Therefore, an existing night vision goggle system contains approximately US$6,000 worth of ANVIS tubes. A standard ANVIS packaged image intensifier tube is made up of a tube module, power supply, packaging, and potting material to stabilize all tube elements. The below method allows for the retention of these expensive image intensifier tubes within the improved night vision device by breaking the ANVIS packaged image intensifier tube down to its constituent elements. The power supply can be sold or reused in a different system. The tube module and optics can be reused in the improved night vision device. The packaging and the majority of the potting can be discarded.

Existing night vision goggle systems may be retrofitted to conform to the configuration of the monocular mounting system 200 and monocular 300 shown in FIG. 1a. It should be understood that the order of the below steps may be modified, and steps may be partially performed or omitted entirely.

In step 401, the mount attachment, mount slide, objective optical elements, image intensifier tubes, eyepiece optical elements, power supply, and power cable are removed from the existing night vision goggles, and the remaining components discarded.

In step 402, the objective optical elements are mounted into a lathe and the objective housing is cut at a first location using a parting tool.

In step 403, the objective optical elements are removed, rotated, and remounted to cut the objective housing at a second location with the parting tool.

In step 404, the objective housing is discarded and a patch of anodizing removed.

In step 405, a new focus ring is attached to the objective lens with a press-fit.

In step 406, the eyepiece optical element is mounted into the lathe and the eyepiece housing is cut at a first location using a parting tool to expose a plastic element.

In step 407, the eyepiece optical element is removed, rotated, and remounted to cut the eyepiece housing at a second location with the parting tool.

In step 408, the eyepiece housing is removed and the plastic lens separated from the lens cell.

In step 409, the plastic lens and lens cell are cleaned.

In step 410, a sealing adhesive such as, but not limited to, room-temperature-vulcanizing silicone (RTV silicone) is deposited on a focus ring for sealing and the lens cell is press-fit into the focus ring.

In step 411, additional sealing adhesive is deposited on the focus ring and the plastic lens is press-fit into the focus ring.

In step 412, the tube housing and power supply are removed from the tube module and the tube housing is discarded. Approximately 2-3 mm of glass are removed and discarded from the front photocathode window part of the tube module that views the outside scene. An outer 1 mm cylinder of access glass of the fiber-optic portion of the tube module that is viewed by the eye is removed and discarded.

In step 413, the power supply and tube module are cleaned and fit with insulating material.

In step 414, the power supply and tube module are repotted in the monocular housing.

In step 415, the mount base and mount attachment are removed from the mount slide.

In step 416, the ball plunger, plate, threaded shaft, and thumb wheel and removed and discarded.

In step 417, another ball plunger containing ceramic balls is reassembled into the mount attachment.

In step 418, an electric contact card or other electrical connective element is inserted on the dovetail plate.

In step 419, the objective optical elements and eyepiece optical elements are reassembled into the monocular.

In step 420, the monocular and lever are connected to the mount bridge via installation of the bridge pins and pin end cams.

In step 421, the mount bridge is connected to the dovetail plate via bridge clamps.

In step 422, the dovetail plate is inserted into the mount base cavity.

In step 423, the power pack is attached to the goggle.

In step 424, the goggle assembly is completed by attaching a new dovetail end plate.

Within the present night vision device 100, collimation, the minimization of divergence and/or convergence of a beam of radiant electromagnetic energy, is achieved through a variety of arrangements between main and sub-components. Within the night vision device 100, the two monoculars 300 are aligned by the fixed dimensions of the cross beam 208. Within each monocular 300, lenses are aligned to the objective focus ring 314 and eyepiece focus ring 315 by design, the tube module 304 is aligned to the monocular housing 301 by the potting, the objective focus ring 314 and eyepiece focus ring 315 are held in alignment to the tube module 304 by the action of the O-ring seals 318 as circular springs. Therefore, collimation of the device 100 is fixed via an optical alignment of each monocular housing 301 to its respective eyepiece focus ring 315, tube module 304, and objective focus ring 314, and via aligning the two monoculars 300 using the cross beam 208.

It should be understood that, as in the original ANVIS design, the present design has been defined herein as a night vision aviation goggle but can be applied to additional night vision devices and systems other than aviation goggles.

It is to be understood that this written description uses examples to disclose the invention, including the best mode, and also to enable any person skilled in the art to make anew the invention. Any dimensions or other size descriptions are provided for purposes of illustration and are not intended to limit the scope of the claimed invention. Additional aspects can include slight variations, as well as greater variations in dimensions as required for use in the industry. The patentable scope of the invention may include other examples that occur to those skilled in the art.

The invention claimed is:

1. A monocular device for a night vision device, the monocular device comprising:
    a monocular housing made from a conductive material and having at least one mounting feature extending along an outer surface of the monocular housing,
    wherein an optical axis of the monocular housing is aligned in parallel with a mechanical axis of the at least one mounting feature;
    an eyepiece optical element having an eyepiece focus ring slidably directly connected to the monocular housing by at least one focus mechanism;
    an objective optical element having an objective focus ring slidably directly connected to the monocular housing by at least one focus mechanism; and
    an image intensifier tube module potted directly to the monocular housing and having a tube power supply and insulative material shielding the image intensifier tube module within the monocular housing in separation from at least the eyepiece optical element and the objective optical element,
    wherein an optical axis of the image intensifier tube module is aligned in parallel with the mechanical axis of the at least one mounting feature,
    wherein a collimation of the monocular device is fixed via a fixed optical alignment of the monocular housing to the eyepiece focus ring, the image intensifier tube module, and the objective focus ring.

2. The monocular device of claim 1, further comprising an electromagnetic interference (EMI) filter conductively connected to the monocular housing.

3. The monocular device of claim 1, wherein the eyepiece focus ring has a conductive outer coating conductively connected to the at least one focus mechanism and the monocular housing.

4. The monocular device of claim 1, wherein the eyepiece focus ring has a first circular spring located at a first end of the eyepiece focus ring, and a second circular spring located at a second end of the eyepiece focus ring, wherein the first and second circular springs center the eyepiece focus ring within the monocular housing.

5. The monocular device of claim 1, wherein the eyepiece optical element further comprises an eyepiece focus adjustment ring having a tapering profile concealing the eyepiece focus adjustment ring from a user's line of sight.

6. The monocular device of claim 1, wherein the objective focus ring has a conductive outer coating conductively connected to the at least one focus mechanism and the monocular housing.

7. The monocular device of claim 1, wherein the objective focus ring has a first circular spring located at a first end of the objective focus ring, and a second circular spring located at a second end of the objective focus ring, wherein the first and second circular springs center the objective focus ring within the monocular housing.

8. The monocular device of claim 1, wherein the insulative material is a sheet of high-voltage insulating material between the monocular housing and the tube module.

9. The monocular device of claim 1, wherein the insulative material is a coating of high-voltage insulating material between the monocular housing and the tube module.

10. The monocular device of claim 1, further comprising a signal reducing means for adjusting tube electro-optical performance via reduction of incoming light signal, the signal reducing means selected from the group consisting of: a glass disk disposed in front of a glass input window of the tube module, a filter deposited on a glass disk that absorbs incoming light energy in a spectral band of intensified night vision, and a disk glued in such a manner that it is not removable from the tube module.

11. The monocular device of claim 1, further comprising at least two integral purge mechanisms extending through the monocular housing, wherein each integral purge mechanism is located at opposite ends of the tube module.

12. The monocular device of claim 1, further comprising at least one tube alignment screw holding the tube module in place in the monocular housing.

13. The monocular device of claim 1, further comprising an attached objective shroud located on an outer end of the objective optical element.

14. The monocular device of claim 1, wherein the monocular device is rotated about the mechanical axis of the at least one mounting feature.

15. A method of making a night vision device, wherein the night vision device is made by retrofitting existing parts, comprising the steps of:
removing at least one eyepiece optical element, stripping mechanical housings from the at least one eyepiece optical element, and rebuilding the at least one eyepiece optical element with the focus mechanisms described in claim 14;
removing at least one objective optical element, stripping mechanical housings from the at least one objective optical element, and rebuilding the at least one objective optical element with the focus mechanisms described in claim 14;
removing at least one tube, stripping the at least one tube to a tube module and a power supply and repotting the tube module in at least one monocular housing described in claim 14;
repotting the at least one eyepiece optical element and at least one objective optical element to the at least one monocular housing; and
removing an existing monocular mounting system and mounting the at least one monocular housing to the monocular mounting system described in claim 14.

16. The method of claim 15, further comprising the step of purging the tube module with vacuum in case that the existing purge is broken.

17. The method of claim 15, wherein the step of removing at least one tube, stripping the at least one tube to a tube module and a tube power supply and repotting the tube module further comprises removing a tube package and tube potting to reduce weight and size, and relocating the tube power supply to a base of the monocular mounting system to reduce its contribution to a moment of inertia relative to a user's head.

18. A night vision device, comprising:
two monocular devices, wherein each monocular device comprises:
a monocular housing made from a conductive material and having at least one mounting feature extending along an outer surface of the monocular housing,
wherein an optical axis of the monocular housing is aligned in parallel with a mechanical axis of the at least one mounting feature,
an eyepiece optical element having an eyepiece focus ring slidably directly connected to the monocular housing by at least one focus mechanism,
an objective optical element having an objective focus ring slidably directly connected to the monocular housing by at least one focus mechanism, and
an image intensifier tube module potted directly to the monocular housing and having a tube power supply and insulative material shielding the image intensifier tube module within the monocular housing in separation from at least the eyepiece optical element and the objective optical element,
wherein an optical axis of the image intensifier tube module is aligned in parallel with the mechanical axis of the at least one mounting feature,
wherein a collimation of the monocular device is fixed via a fixed optical alignment of the monocular housing to the eyepiece focus ring, the image intensifier tube module, and the objective focus ring; and
a monocular mounting system interconnecting the two monocular devices using a cross beam,
the cross beam being a mount bridge having a first monocular bridge at a first end and a second monocular bridge at a second end,
wherein each monocular device comprises at least one mounting feature connected to either the first monocular bridge or second monocular bridge such that the two monocular devices extend at a first fixed angle to each other and at a second fixed angle to an observer's eyes such that both monocular devices are optically aligned to a fixed point in space in front of the night vision device.

19. The night vision device of claim 18, wherein a collimation of the night vision device is fixed via attachment of the two monocular devices to the cross beam.

20. The night vision device of claim 18, further comprising a mount slide rotatably connected to a helmet by a mount attachment.

21. The night vision device of claim 20, further comprising a dovetail plate slidably located within a slide cavity within the mount slide.

22. The night vision device of claim 21, wherein the dovetail plate comprises a sliding electrical interface including a set of electrical traces and/or contacts interacting with complementary electrical traces and/or contacts mounted in the mount slide.

23. The night vision device of claim 22, further comprising a cam pin located within the mount slide, the cam pin connected to a lever protruding from the mount slide, wherein rotating the lever to a first position results in the cam pin not being in contact with the dovetail plate, and wherein rotating the lever to a second position results in the cam pin rotating into contact with the dovetail plate and a frictional interface between the cam pin and the dovetail plate preventing fore-and-aft movement of the dovetail plate.

24. The night vision device of claim 21, further comprising at least one bridge clamp connecting the mount bridge to the dovetail plate.

25. The night vision device of claim 21, further comprising a complete electrical shield surrounding all electrical components of the night vision device, the electrical shield comprising the eyepiece optical elements conductively connected to the monocular housings, the monocular housings conductively connected to the mounting features, the mounting features conductively connected to the cross beam, the cross beam conductively connected to the dovetail plate, the dovetail plate conductively connected to the mount slide.

26. The night vision device of claim 18, wherein the cross beam is conductively connected to each monocular housing.

27. The night vision device of claim 18, wherein the cross beam has a hollow configuration.

28. The night vision device of claim 18, further comprising two monocular bridge pins extending between and interconnecting the monocular bridge and the two monocular devices.

29. The night vision device of claim 28, further comprising two fore pin end bushings and two aft pin end bushings, wherein each fore pin end bushing has a frictional fit between one monocular housing and a first end of one monocular bridge pin, and each aft pin end bushing has a frictional fit between one monocular housing and a second end of one monocular bridge pin to fix collimation of the two monocular devices.

30. The night vision device of claim 28, further comprising at least one fore pin end bushing and at least one aft pin end bushing interposed between one monocular housing and one monocular bridge pin, wherein at least one fore pin end bushing or aft pin end bushing is a rotatable cam which is rotatable to adjust collimation of the two monocular devices and fixed in place to fix collimation of the two monocular devices.

* * * * *